(12) United States Patent
Fukayama et al.

(10) Patent No.: US 6,239,662 B1
(45) Date of Patent: May 29, 2001

(54) MIS VARIABLE CAPACITOR AND TEMPERATURE-COMPENSATED OSCILLATOR USING THE SAME

(75) Inventors: Hiroyuki Fukayama; Yasuhiro Sakurai, both of Sayama (JP)

(73) Assignee: Citizen Watch Co., Ltd., Tokyo (JP)

( * ) Notice: Subject to any disclaimer, the term of this patent is extended or adjusted under 35 U.S.C. 154(b) by 0 days.

(21) Appl. No.: 09/255,337

(22) Filed: Feb. 23, 1999

(30) Foreign Application Priority Data

Feb. 25, 1998 (JP) .................................................. 10-043141
Nov. 26, 1998 (JP) .................................................. 10-335192

(51) Int. Cl.[7] ................................. H03B 5/04; H03B 5/36
(52) U.S. Cl. ...................... 331/66; 331/116 FE; 331/158; 331/177 V
(58) Field of Search .................................. 331/66, 116 R, 331/116 FE, 117 R, 117 FE, 158, 176, 177

(56) References Cited

U.S. PATENT DOCUMENTS 3,909,748 * 9/1975 Yuan et al. ........................ 331/117 R
4,012,762 * 3/1977 Abe et al. ............................... 357/52

* cited by examiner

*Primary Examiner*—David Mis
(74) *Attorney, Agent, or Firm*—Armstrong, Westerman, Hattori, McLeland & Naughton, LLP

(57) ABSTRACT

An insulating film and a conducting film are formed in that order on an N type semiconductor substrate to form a capacitor structure of "conducting film—insulating film—semiconductor"; a heavily doped P region having a high impurity concentration is provided on the N type semiconductor substrate to contact a covered region which is covered with the conducting film; and furthermore a heavily doped N region for conducting an electrode on the semiconductor side is provided and connected with the heavily doped P region, resulting in quickly variance of the capacitance values in accordance with the voltage applied between the heavily doped N region and a terminal of the conducting film.

8 Claims, 8 Drawing Sheets

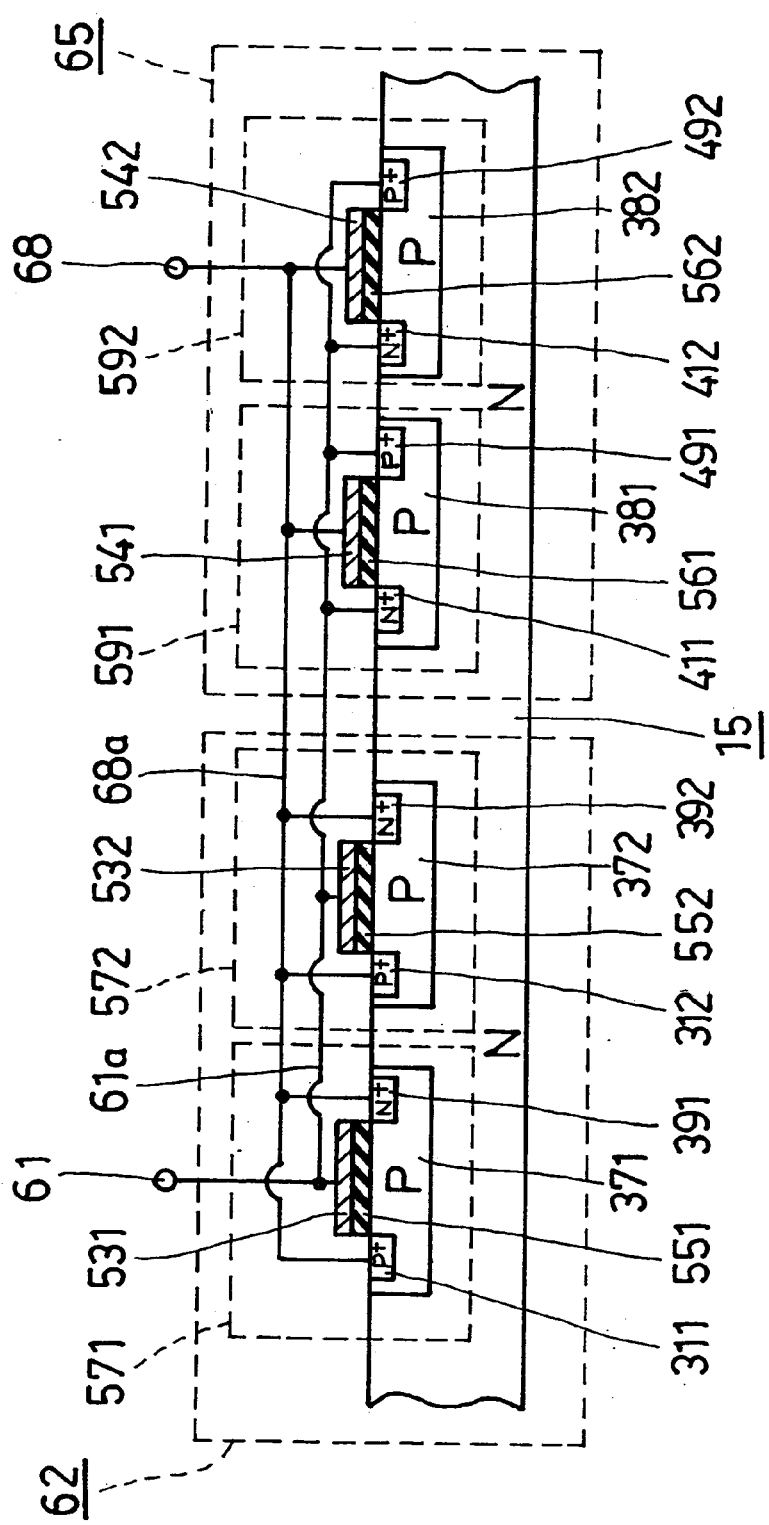

MIS VARIABLE CAPACITOR AND TEMPERATURE-COMPENSATED OSCILLATOR USING THE SAME

BACKGROUND OF THE INVENTION

1. Field of the Invention

This invention relates to a MIS variable capacitor formed on a semiconductor substrate and a temperature-compensated oscillator using the same.

2. Description of the Related Art

MIS variable capacitors vary in capacitance in accordance with an applied direct current voltage, thus being used for controlling the oscillation frequency of a voltage control oscillator. Moreover, since its structure resembles that of a MOS integrated circuit, it is quite easy that the MIS variable capacitor is integrated with the MOS integrated circuit, so that it is also used as a capacitor element which is provided on the semiconductor substrate forming the MOS integrated circuit.

Furthermore, the MIS variable capacitor has an advantage of obtaining a wide range of adjustment of the oscillation frequency even at low voltages, since a large capacitance variation can be obtained in a small voltage range at low voltages, compared with a variable capacitance diode (varicap) utilizing voltage dependence of a depletion layer capacitance in a PN junction of a semiconductor.

An example of conventional MIS variable capacitors will be explained briefly with reference to FIG. 12. In the MIS variable capacitor, an insulating film 89 and a conducting film 87 are formed in that order on an N type semiconductor substrate 91, and a heavily doped N region 83 with an impurity concentration heavier than that of the semiconductor substrate 91 is provided to contact a covered region 91a of the semiconductor substrate 91 which is covered with the insulating film 89.

In the MIS variable capacitor, a terminal 85 of an electrode on the conducting film side and a terminal 81 of an electrode on the semiconductor side are respectively conducted from the conducting film 87 and from the heavily doped N region 83, to form a variable capacitor composed of conducting film—insulating film—semiconductor. The capacitance value of the MIS variable capacitor varies by the voltage Vi applied between the terminal 81 and the terminal 85.

For example, as shown in FIG. 14, when the voltage Vi which is applied between the terminals 81 and 85 increases from the voltage value Va (negative voltage on the terminal 85 side in relation to the terminal 81) to the voltage value Vb (positive voltage on the terminal 85 side in relation to the terminal 81), changing form minus to plus at the voltage value Vc in between, the capacitance value of the MIS variable capacitor shown in FIG. 12 increases as shown by a curved line 80. In FIG. 14, the horizontal axis indicates voltage values of the voltage vi applied between the terminals 81 and 85 and the vertical axis indicates capacitance values. The variation in capacitance value is caused by the actions, described hereinafter, in the covered region 91a of the semiconductor substrate 91 shown in FIG. 12.

At low voltage Va, as shown in FIG. 12, holes of minority carriers are induced in the vicinity of the surface of the covered region 91 a to form an inversion layer 92 and a depletion layer 94 thereunder. When the voltage value rises from that state, the thickness of the depletion layer 94 reduces responsively. The inversion layer 92 becomes conductive and the depletion layer 94 becomes an insulating layer.

In this example, since the depletion layer 94 having insulating properties exists in the covered region 91a, the MIS variable capacitor is configured such that a capacitor composed of the conducting film 87 and the inversion layer 92 sandwiching the insulating film 89 and a capacitor composed of the inversion layer 92 and a portion of the semiconductor substrate 91 under the depletion layer 94 sandwiching the depletion layer 94 are connected in series. Accordingly, its capacitance value is a serial combined capacitance value of both capacitors.

When the thickness of the depletion layer 94 reduces as the applied voltage Vi increases, the capacitance of the capacitor which is formed across the depletion layer 94 increases, so that the capacitance of the MIS variable capacitor also comes to increase as shown in FIG. 14.

However, when the applied voltage Vi further rises to reach the voltage value Vb shown in FIG. 14, the depletion layer 94 disappears as shown in FIG. 13 and an accumulation layer 95 in which electrons are induced on the surface of the covered region 91a is then formed. Since the accumulation layer 95 is conductive, when the depletion layer 94 having insulating properties disappears, the capacitance value of the MIS variable capacitor becomes equal to the capacitance value of the capacitor which is formed across the insulating film 89 of which the film thickness does not change, thus being a fixed capacitance value at voltages exceeding Vb.

As described above, the MIS variable capacitor has the property of varying in capacity in relation to the voltage change in a certain range of the applied voltage value, but the capacitance variation poorly responds the voltage change. Therefore, there is a disadvantage that, when the voltage applied between the terminals 81 and 85 is momentary changed in the reducing direction from the voltage value Vb to the voltage value Va in FIG. 14, the variation of the capacitance value can not catch up the voltage change and the capacitance value slowly varies after the voltage changes.

This is presumed to be because, when the applied voltage is reduced, holes are induced in the vicinity of the surface of the covered region 91a to form the inversion layer 92, but the holes are minority carriers in the N type semiconductor substrate 91 and so the holes are supplied slowly, therefore time is needed for the concentration of minority carriers to reach the thermal equilibrium. Until the concentration of minority carriers reaches the thermal equilibrium, the capacitance of the MIS variable capacitor varies since the thickness of the depletion layer 94 changes.

Accordingly, there is a disadvantage that when the above conventional MIS variable capacitor is used for frequency control of the oscillation circuit in the voltage control oscillator, since the capacitance value does not respond the change in control voltage, the oscillation frequency changes with delay in relation to the change in control voltage, which is a serious trouble in response of the frequency of the voltage control oscillator.

Moreover, it is also a disadvantage that since the MIS variable capacitor reduces greatly in capacitance value because the depletion layer 94 is provided after forming of the inversion layer 92, when the MIS variable capacitor is used as a standard capacitor for phase compensation of an amplifier or the like, the capacitor function weakens in a range of low voltages where the inversion layer is formed and the required capacitance can not be obtained, therefore a range of usable voltage is limited to a range above a predetermined value.

SUMMARY OF THE INVENTION

This invention is accomplished to solve the above disadvantages in an MIS variable capacitor and the first object of the present invention is to improve response of the capacitance variation in relation to the change in applied voltage.

The second object of the present invention is to reduce the degree of a drop in capacitance value in the voltage range where an inversion layer is formed, so as to enlarge the voltage range where the capacitor can be effectively used.

The third object of the present invention is to provide a temperature-compensated oscillator which can perform compensation control of an oscillation frequency in relation to temperature changes with a good response.

To achieve the above described first and second objects, this invention provides an MIS variable capacitor having a capacitor structure of conducting film—insulating film—semiconductor which is composed of a semiconductor of a first conduction type, an insulating film formed on the semiconductor of the first conduction type, and a conducting film formed on the insulating film, in which a region of a second conduction type is formed in the semiconductor of the first conduction type to contact a covered region covered with the conducting film.

The MIS variable capacitor is provided with the region of the second conduction type for providing minority carriers in the semiconductor of the first conduction type, thus being instantaneously provided with minority carries even when the applied voltage is rapidly dropped from a high value, and an inversion layer and a depletion layer being formed therein, to achieve a thermal equilibrium immediately. Accordingly, response of the capacitance variation in relation to the voltage change greatly improves, thus attaining the first object.

Additionally, in the above MIS variable capacitor, if the semiconductor of the first conduction type and the region of the second conduction type are electrically connected in advance, it can be utilized immediately.

In this MIS variable capacitor, when the applied voltage is low and the inversion layer is sufficiently formed, the inversion layer becomes a conductive region having the conduction type opposite to the original type, and the region of the second conduction type serves as an electrode-conductive portion on the inversion layer side of a capacitor which is made up of the conducting film and the inversion layer sandwiching the insulating film. The capacitance value is the same as that in a state where the applied voltage is sufficiently high and the depletion layer disappears, which is equal to the capacitance value of a capacitor which is made up sandwiching the insulating film, and is a constant value.

As a result, since a constant capacitance value can be obtained for utilizing as a capacitor even in a range where the applied voltage is low, the voltage range where the capacitor can be efficiently used enlarges compared with a conventional MIS variable capacitor, so that the second object can be also attained.

In the MIS variable capacitor, the semiconductor of the first conduction type may be an N type semiconductor substrate and the region of the second conduction type may be a P region.

Alternatively, the semiconductor of the first conduction type may be a P type semiconductor substrate and the region of the second conduction may be an N region.

Moreover, if the semiconductor of the first conduction type is provided with the region of the first conduction type having an impurity concentration heavier than that of the above semiconductor without contacting the aforesaid region of the second conduction type, the region of the first conduction type can serve as an electrode-conductive portion on the semiconductor side, which is convenient.

Furthermore, in this invention, a plurality of MIS variable capacitor elements, each of which has: a capacitor structure of conducting film—insulating film—semiconductor composed of a region of the second conduction type formed in a semiconductor of the first conduction type; an insulating film formed on the region of the second conduction type; and a conducting film formed on the insulating film, and in which a heavily doped region of the second conduction type, having an impurity concentration heavier than that of the region of the second conduction type, is provided in the region of the second conduction type, and a region of the first conduction type is formed to contact a covered region covered with the conducting film in the region of the second conduction type, are connected in parallel to form an MIS variable capacitor.

The conducting films of one or more of the above plurality of MIS variable capacitor elements are connected to the heavily doped regions of the second conduction type and the regions of the first conduction type which are separately provided in the regions of the second conduction type in the remaining MIS variable capacitor elements, and the heavily doped regions of the second conduction type and the regions of the first conduction type which are separately provided in the regions of the second conduction type of the aforesaid one or more MIS variable capacitor elements are respectively connected to the conducting films of the aforesaid remaining MIS variable capacitor elements.

In the MIS variable capacitor structured as described above, a plurality of MIS variable capacitor elements are connected in parallel so as to be applied with the voltage oppositely in polarity, so that capacitance variation characteristics of the MIS variable capacitor elements on both sides in relation to a voltage change become symmetrical, therefore decreasing a range of voltage where the combined capacitance decreases and decreasing the amount of capacitance reduction. Accordingly, the aforesaid second object can be attained more efficiently.

Moreover, a plurality of the MIS variable capacitor elements similar to the above are connected in parallel to make an MIS capacitor element group, and a plurality of the MIS variable capacitor element groups may be formed to compose an MIS variable capacitor.

In this case, the conducting film of each of MIS variable capacitor elements forming one or more of the above plurality of MIS variable capacitor element groups is connected to the heavily doped region of the second conduction type and the region of the first conduction type which are separately formed in the region of the second conduction type of each of MIS variable capacitor elements forming the remaining MIS variable capacitor element groups, and the heavily doped region of the second conduction type and the region of the first conduction type which are separately formed in the region of the second conduction type of each of MIS variable capacitor elements forming the aforesaid one or more MIS variable capacitor element groups are connected respectively to the conducting film of each of MIS variable capacitor elements forming the aforesaid remaining MIS variable capacitor element groups.

When the MIS variable capacitor is formed as described above, the number of MIS variable capacitor elements, connected in parallel so as to be applied with the voltage in reverse polarity, increases, therefore more decreasing a range of voltage where the combined capacitance of the MIS variable capacitor decreases and decreasing the amount of reduction. Accordingly, the aforesaid second object can be attained more efficiently.

Furthermore, in this invention, to attain the aforesaid third object, in a temperature-compensated oscillator which includes: an oscillation circuit; a temperature detecting circuit detecting the temperature of the oscillation circuit; a control voltage generating circuit inputting a signal corresponding to the temperature detected by the temperature detecting circuit and generating a control voltage; and a frequency adjusting circuit having a voltage variable capacitor which varies in capacitance corresponding to the control voltage from the control voltage generating circuit, and controlling the oscillation frequency by the oscillation circuit, the voltage variable capacitor of the frequency adjusting circuit is the aforesaid MIS variable capacitor according to this invention.

More specifically, the above voltage variable capacitor is made to have a capacitor structure of conducting film—insulating film—semiconductor composed of a semiconductor of the first conduction type, an insulating film formed on the semiconductor of the first conduction type , and a conducting film formed on the insulating film, in which a region of the second conduction type is provided in the semiconductor of the first conduction type to contact a covered region covered with the conducting film.

According to the temperature-compensated oscillator, when the temperature of the oscillation circuit changes and the oscillation frequency changes due to its temperature characteristics, the temperature detecting circuit detects the temperature change and enters a signal corresponding to the detected temperature into the control voltage generating circuit, and the control voltage generating circuit generates a control voltage corresponding to the signal, which is applied across the voltage variable capacitor of the frequency adjusting circuit. Thereby, the capacitance of the above capacitor varies in a quick response to the control voltage, which rapidly controls the oscillation frequency of the oscillation circuit so as to compensate the frequency variation due to the temperature change.

The above and other objects, features and advantages of the invention will be apparent from the following detailed description which is to be read in conjunction with the accompanying drawings.

BRIEF DESCRIPTION OF THE FIGURES

FIG. 10 is a schematic sectional view showing the structure of a third embodiment of an MIS variable capacitor according to the present invention;

DETAILED DESCRIPTION OF THE PREFERRED EMBODIMENTS

Embodiments of this invention will be described hereinafter in reference to the accompanying drawings.

First, a first embodiment of an MIS variable capacitor according to this invention will be explained.

Figure 1:
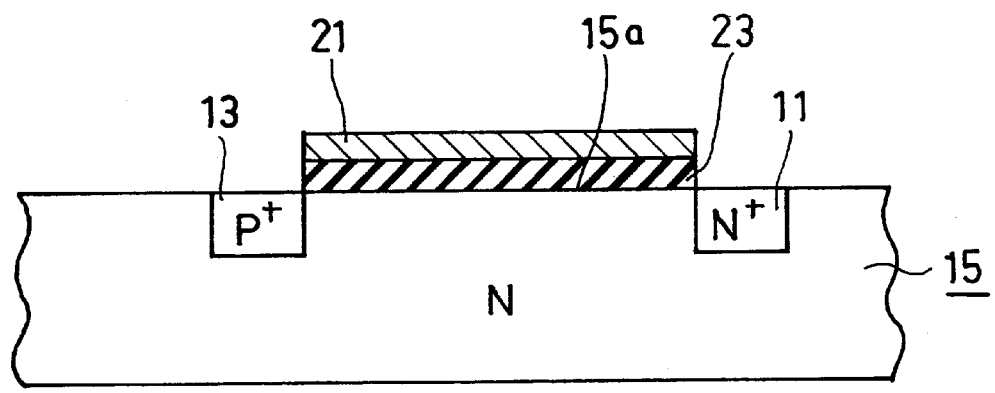
FIG. 1 is a schematic sectional view showing the structure of a first embodiment of an MIS variable capacitor according to the present invention.

First embodiment:

FIG. 1 is a schematic sectional view showing the structure of the first embodiment of the MIS variable capacitor according to the present invention. It should be noted that hatching is not used in illustrating to a semiconductor substrate for convenience of illustration. Other sectional views are similar to above.

The MIS variable capacitor has a capacitor structure of "conducting film—insulating film—semiconductor" in which an insulating film 23 and a conducting film 21 are tiered to form in that order on the top surface of an N type semiconductor substrate 15 which is a semiconductor of a first conduction type.

In the one end portion of a covered region 15a of the N type semiconductor substrate 15 which is covered with the conducting film 21, a heavily doped N region 11 (shown by $N^+$ in FIG. 1) of which the impurity concentration is heavier than that of the N type semiconductor substrate 15 is provided. Moreover, a heavily doped P region 13 (shown by $P^+$ in FIG. 1), which is a P type region provided in the substrate having a second conduction type having heavy impurity concentration, is provided to contact the other end portion of the covered region 15a.

Figure 2:
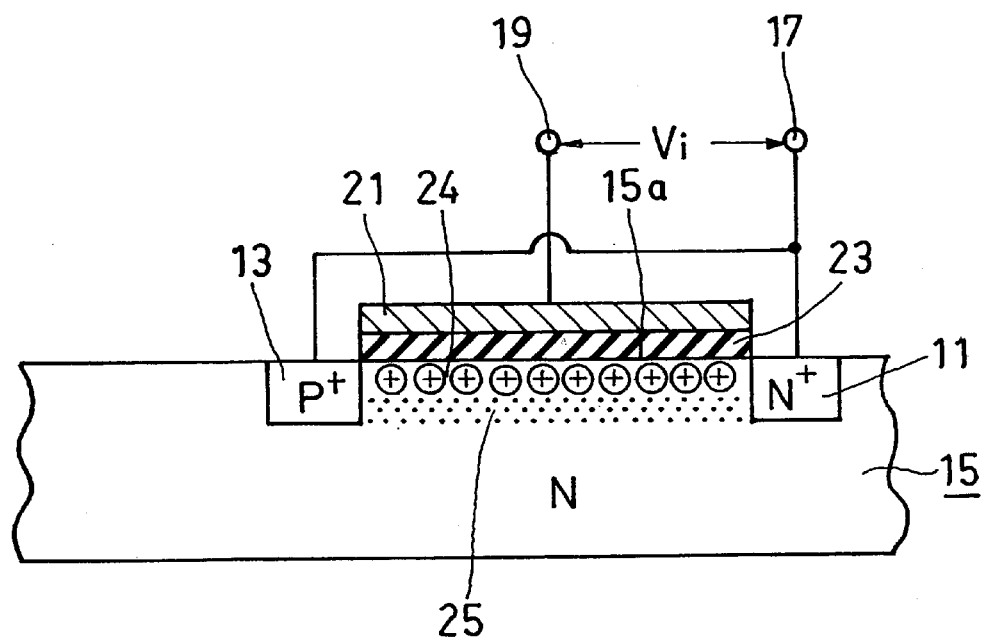
FIG. 2 is a schematic view for explaining the properties of the first MIS variable capacitor at low applied voltage.

In the MIS variable capacitor, as shown in FIG. 2, a terminal 19 of an electrode on the conducting film side and a terminal 17 of an electrode on the semiconductor side are respectively conducted from the conducting film 21 and the heavily doped N region 11. Furthermore, the heavily doped N region 11 (it may be an electrode provided on the N type semiconductor substrate 15 side) and the heavily doped P region 13 are electrically connected.

Next, the properties and functions of the MIS variable capacitor of the first embodiment will be explained in reference to FIGS. 2 to 4, and 8.

Figure 8:
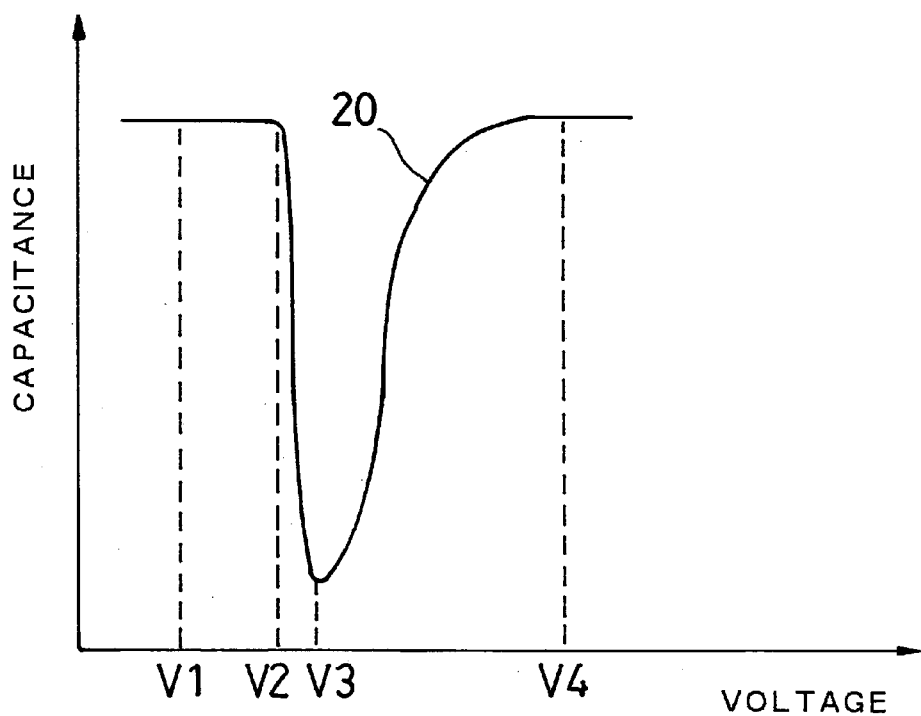
FIG. 8 is a line graph showing the relation between the applied voltage and the capacitance value of the MIS variable capacitor of the first embodiment of the present invention.

When the voltage Vi is applied between a terminal 17 of the electrode on the semiconductor side and the terminal 19 of the electrode on the conducting film side of the MIS variable capacitor as shown in FIG. 2, and the voltage Vi is increased from the voltage value V1 (negative voltage on the terminal 19 side in relation to the terminal 17) to the voltage value V4 (positive voltage on the terminal 19 side to the terminal 17) as shown in FIG. 8, the capacitance value between the terminals 17 and 19 of the MIS variable capacitor varies as shown by a curved line 20 in FIG. 8.

More specifically, the capacitance of the MIS variable capacitor shows a constant value until the voltage value of the applied voltage Vi reaches V2. Thereafter it quickly decreases and shows the minimum value at the point where the voltage value reaches V3 and, thereafter, it quickly rises until the voltage value reaches V4, which results in a substantial V-shape characteristic curve, and finally shows a fixed capacitance value when the voltage value exceeds V4.

It is noted that the horizontal axis shows the voltage value applied between the terminals 17 and 19 and the vertical axis shows the capacitance value between the terminals 17 and 19 in FIG. 8.

The variation in capacitance value in the MIS variable capacitor of this embodiment, as described above, is a result of the following functions in the covered region 15a of the semiconductor substrate 15.

In a state where the applied voltage Vi is at the low negative voltage value V1, a large number of holes of minority carriers are induced and relatively more than the number of electrons of majority carriers in the vicinity of the surface of the covered region 15a as shown in FIG. 2, which is like a P type semiconductor. Therefore, in the vicinity of the surface, an inversion layer 24 of which the conduction type is opposite to that of the N type semiconductor substrate 15 is formed, and a depletion layer 25 is formed thereunder.

In a state where the applied voltage Vi is lower than the voltage value V2, the concentration of holes existing in the inversion layer 24 is heavy. Therefore the inversion layer 24 becomes equivalent to a conductive electrode.

Therefore, the conducting film 21 and the inversion layer 24 sandwich the insulating film 23 to make up a capacitor, and the heavily doped P region 13 serves as an electrode-conducted portion on the inversion layer side of the capacitor. Consequently, the MIS variable capacitor becomes a voltage variable capacitor and its capacitance value is equal to that of the capacitor sandwiching the insulating film 23, to be a constant value as shown in FIG. 8.

At this time, the depletion layer 25 is formed, but the inversion layer 24, the heavily doped P region 13 and the heavily doped N region 11 are in a conducting state, thus a capacitor across the depletion layer 25 is not provided.

Next, when the applied voltage Vi rises above the voltage value V2 shown in FIG. 8, electrons are drawn to the conducting film 21 side and holes are simultaneously chased away, therefore the concentration of holes in the inversion layer 24 is relatively reduced. Then the inversion layer 24 gets out of a state of acting as a equivalency to a conductive electrode, and a capacitor becomes to be gradually formed by the inversion layer 24 and the semiconductor substrate 15 sandwiching the depletion layer 25.

Figure 4:
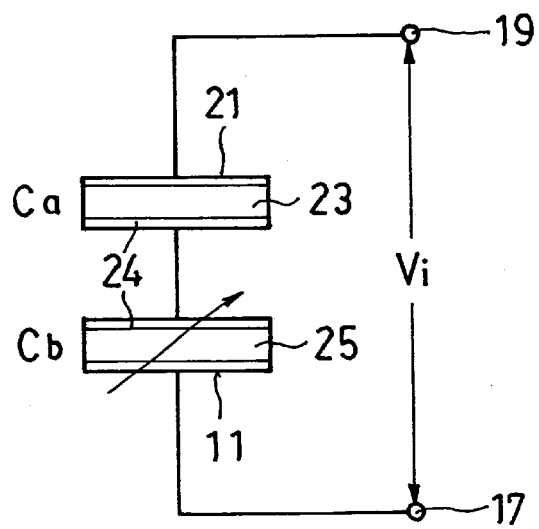
FIG. 4 is an equivalent circuit diagram of the first MIS variable capacitor.

Here, referring to a capacitor which is formed sandwiching the insulating film 23 as Ca, and a capacitor which is formed sandwiching the depletion layer 25 as Cb, the MIS variable capacitor can be illustrated as an equivalent circuit in which the capacitor Ca and the capacitor Cb are connected in series as shown in FIG. 4. Accordingly, the capacitance value of the MIS variable capacitor is a serial combined capacitance value of the capacitor Ca and the capacitor Cb, thus quickly decreasing under the influence of the capacitor Cb.

The capacitance value reaches its minimum value when the applied voltage Vi reaches the voltage value V3 shown in FIG. 8, and rapidly increases while the positive voltage further increases on the terminal 19 side. The actions in this process are as follows.

The capacitor Cb corresponds to the capacitor which is formed sandwiching the depletion layer 25, and is a variable capacitor according to voltage, since the thickness of the depletion layer 25 gradually reduces in a process where the applied voltage Vi rises. This is because the capacitance value of the capacitor Cb is in inverse proportion to the thickness of the depletion layer 25, therefore the capacitance increases in accordance with a reduction in thickness of the depletion layer 25 corresponding to a rise of the voltage value.

The MIS variable capacitor functions as equivalent to a capacitor in which the capacitor Ca and the capacitor Cb are connected in series, so that the serial combined capacitance value increases as the capacitance value of the capacitor Cb increases. Therefore, the capacitance value of the MIS variable capacitor increases as the voltage rises.

Figure 3:
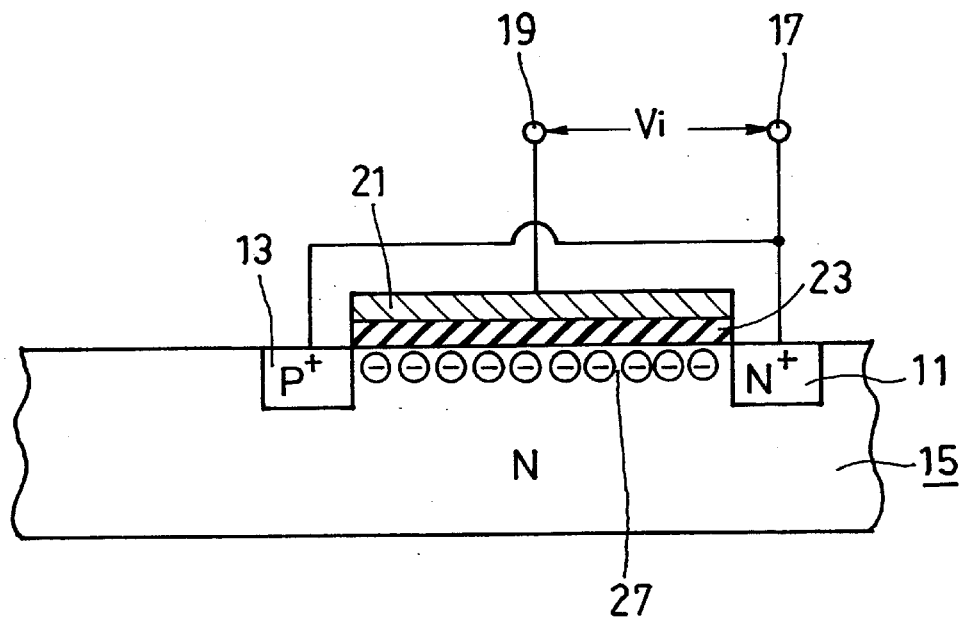
FIG. 3 is a schematic view for explaining the properties of the first MIS variable capacitor at high applied voltage.

However, when the applied voltage Vi reaches the voltage value V4 shown in FIG. 8, since the depletion layer 25 itself disappears, there is no influence of the capacitor Cb. Simultaneously, as shown in FIG. 3, a large number of electrons in the semiconductor substrate 15 are drawn to the conducting film 21 side which a positive voltage is applied, which allows an accumulation layer 27 to be formed in the vicinity of the surface of the covered region 15a. The accumulation layer 27 becomes equivalent to a conductive electrode, and so comes to be in a state of conducting to the heavily doped N region 11.

Accordingly, in a state where the applied voltage Vi is above the voltage value V4, the capacitance value of the MIS variable capacitor is equivalent to that of the capacitor Ca, which consists of the conducting film 21 and the accumulation layer 27 sandwiching the insulating film 23, and therefore is to be a constant value.

The MIS variable capacitor varies in capacitance value as described above in relation to changes of the voltage Vi which is applied between the terminals 17 and 19. Even when the applied voltage Vi is changed rapidly, as well as when it is changed slowly, the capacitance value varies quickly responding the change.

In a conventional MIS variable capacitor, holes of minority carriers can not be supplied responding a rapid change in voltage when the applied voltage is rapidly decreased, thus there is a disadvantage in that variations in capacitance can not catch up changes in voltage.

On the other hand, in the MIS variable capacitor of the present invention, the heavily doped P region 13 is provided to contact the covered region 15a, so that holes are promptly supplied from the heavily doped P region 13. Accordingly, the number of holes in response to the applied voltage are instantaneously supplied, the concentration of holes in the inversion layer 24 reaches a thermal equilibrium in quite a short time, and the thickness of the depletion layer 25 also quickly reaches a fixed value. Consequently, the capacitance value of the MIS variable capacitor according to the present invention varies without delay responding a quick change of the applied voltage Vi.

This action is just the same with the case where the applied voltage Vi is instantaneously changed from the voltage value V4 to any voltage value lower than V4.

The conventional MIS variable capacitor is obliged to drop in capacitance due to the existence of a depletion layer in a state where the voltage is applied to form an inversion layer. On the other hand, in the MIS variable capacitor of this embodiment, the heavily doped P region 13 and the heavily doped N region 11 are connected each other and connected to the terminal 17 of the electrode on the semiconductor side. Therefore, in a state where the inversion layer 24 serves as equivalent to a conductive electrode, a capacitor sandwiching a depletion layer is not provided, thus a drop in capacitance value due to the existence of the depletion layer can be avoided.

Accordingly, this allows a range of voltage where the capacitance value shows a fixed value to enlarge correspondingly.

It should be noted that the MIS variable capacitor of the first embodiment is provided with the heavily doped N region 11 on one end of the covered region 15a of the N type of semiconductor substrate 15 as a conducted portion of the electrode on the semiconductor side, thereby reducing resistance. The heavily doped N region 11 may be formed anywhere in the semiconductor substrate 15, at any position convenient to the conducted portion of the electrode on the semiconductor side, without contacting the heavily doped P region 13.

When a metal film having a large area is formed on a rear face or the like of the semiconductor substrate 15 and is regarded as an electrode on the semiconductor side, the heavily doped N region 11 may be omitted.

Alternatively, a semiconductor forming a capacitor may be a P type semiconductor substrate, a region as a conducted portion of the electrode on the semiconductor side may be a heavily doped P region, and a region for supplying minority carriers may be a heavily doped N region.

The region for supplying minority carriers is of a conduction type opposite to the semiconductor forming a capacitor and is preferably heavy in impurity concentration. It is unnecessary to be a heavily doped region and it may be to provide sufficient minority carriers of semiconductor, forming a capacitor, when an inversion layer is formed.

Second embodiment:

Next, the second embodiment of the MIS variable capacitor according to this invention will be explained with reference to FIGS. 5, 6 and 9.

Figure 5:
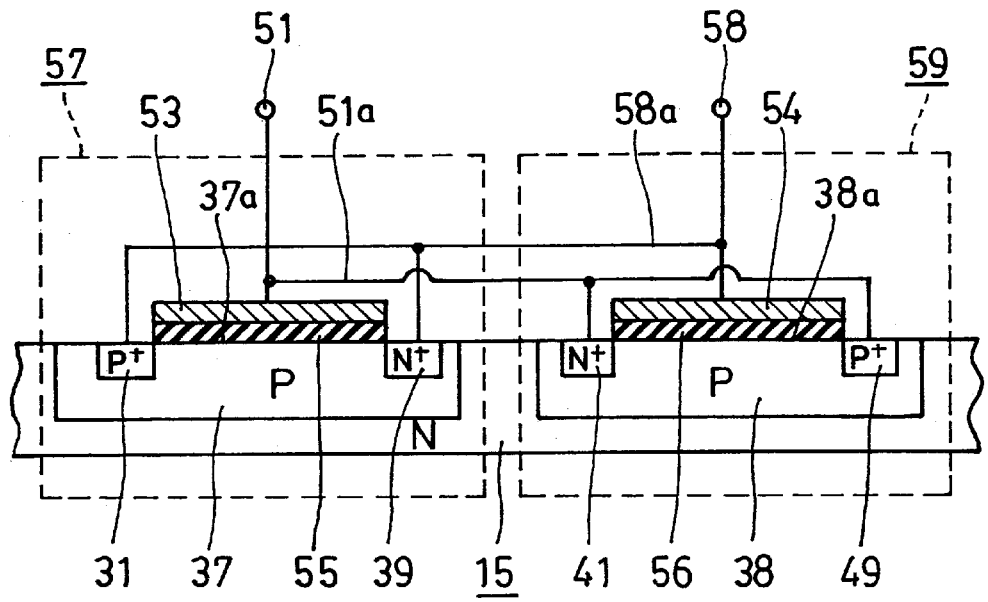
FIG. 5 is a schematic sectional view showing the structure of a second embodiment of an MIS variable capacitor according to the present invention.

FIG. 5 is a schematic sectional view showing the structure of the MIS variable capacitor.

The MIS variable capacitor, as shown in FIG. 5, has a structure in which P regions (P wells) 37, 38 of regions of a second conduction type are provided at an interval in an N type semiconductor substrate 15 of a semiconductor of a first conduction type. On the respective P regions 37, 38, formed are two MIS variable capacitor elements 57, 59 of which the conduction type of each semiconductor region is opposite to that of the MIS variable capacitor of the above described first embodiment. The MIS variable capacitor elements 57, 59, with polarities being placed in reverse, are connected in parallel.

The MIS variable capacitor element 57 has a capacitor structure of "conducting film—insulating film—semiconductor" in which an insulating film 55 and a conducting film 53 are formed in that order on the top surface of the P region 37 of the second conduction type. Moreover, a heavily doped N region 39 of the first conduction type having a heavy impurity concentration is provided to contact one end portion of a covered region 37a of the P region 37, which is covered with the conducting film 53 as a supply portion of minority carriers. On the other end portion of a covered region 37a, provided is a heavily doped P region 31 of the second conduction type having an impurity concentration heavier than that of the P region 37 as a conducted portion of an electrode on the semiconductor side.

The MIS variable capacitor element 59 has a capacitor structure of "conducting film—insulating film—semiconductor" in which an insulating film 56 and a conducting film 54 are formed in that order on the top surface of the P region 38 of the second conductive type. Moreover, a heavily doped N region 41 of the first conduction type having a heavy impurity concentration is provided to contact one end portion of the covered region 38a of the P region 38, which is covered with the conducting film 54 as a supply portion of minority carriers. On the other end portion of the covered region 38a, provided is a heavily doped P region 49 of the second conduction type having an impurity concentration higher than that of the P region 38 as a conducted portion of an electrode on the semiconductor side.

The MIS variable capacitor elements 57 and 59, with polarities being placed in reverse, are connected in parallel as follows.

The conducting film 53 of the MIS variable capacitor element 57 is connected to the heavily doped N region 41 and the heavily doped P region 49, which are provided separately in the P region 38 of the MIS variable capacity element 59, by an interconnection 51a, and the interconnection 51a is connected to a terminal 51.

Additionally, the heavily doped N region 39 and the heavily doped P region 31 which are separately provided in the P region 37 of the MIS variable capacitor element 57 are connected to the conducting film 54 of the MIS variable capacitor element 59 by an interconnection 58a, and the interconnection 58a is connected to a terminal 58.

The MIS variable capacitor in this embodiment is composed by connecting the MIS variable capacitor element 57 and the MIS variable capacitor element 59, which have effects equal to the MIS variable capacitor in the first embodiment, in parallel, with polarities being placed in reverse to each other.

Figure 6:
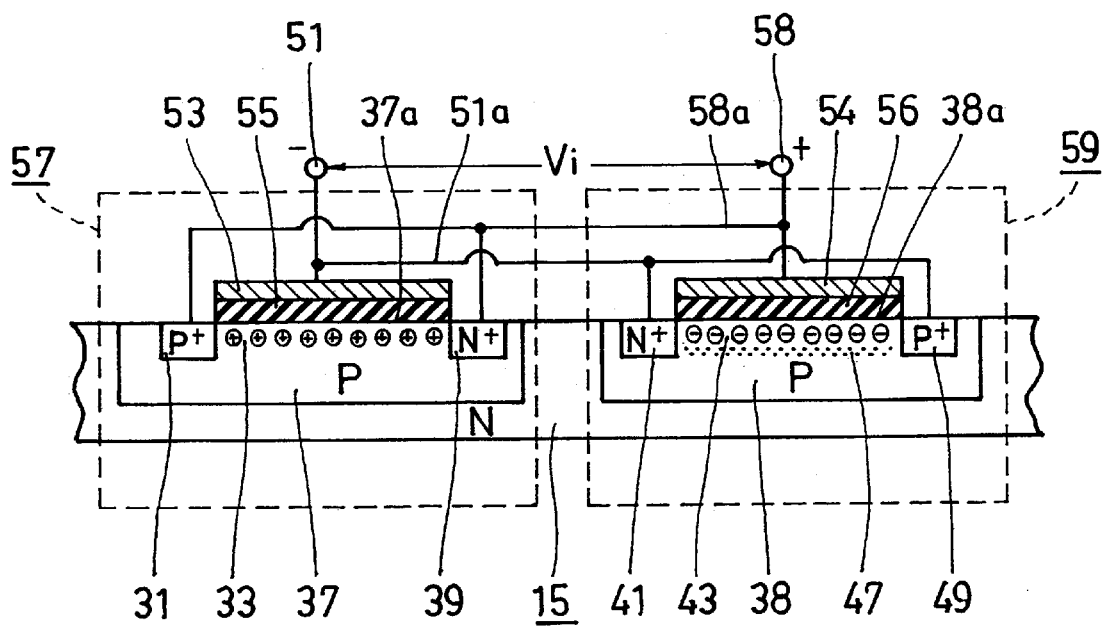
FIG. 6 is a schematic view for explaining the motion of the second MIS variable capacitor.

Therefore, as shown in FIG. 6, when the voltage Vi is applied between terminal 51 and terminal 58, polarities of the voltage applied on respective electrodes are opposite to each other between the conducting films 53, 54 sides and the semiconductors (P regions 37, 38) sides of the MIS variable capacitor elements 57, 59.

When the depletion layer is formed, each of the MIS variable capacitor elements 57, 59 becomes equivalent to a capacitor which is provided sandwiching the insulating film 55 or 56 and a capacitor which is provided sandwiching the depletion layer are connected in series. Regarding the capacitors, which are formed sandwiching the respective insulating films 55, 56 of the MIS variable capacitor elements 57, 59 as Ca1, Ca2, and the capacitors which are formed sandwiching the respective depletion layers which are formed under the inversion layers formed in the vicinity of the surfaces of the P regions 37, 38 as Cb1, Cb2, the MIS variable capacitor is equivalent to a capacitor forming an equivalent circuit shown in FIG. 7.

Next, actions when the voltage Vi is applied between terminal 51 and terminal 58 of the MIS variable capacitor will be explained below with reference to FIG. 9.

Figure 9:
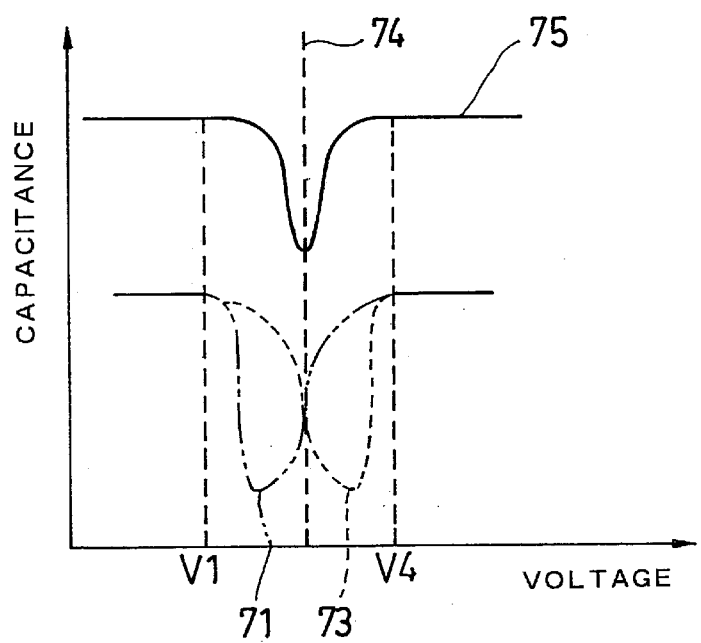
FIG. 9 is a line graph showing the relation between the applied voltage and the capacitance value of the MIS variable capacitor of the second embodiment of the present invention.
Figure 14:
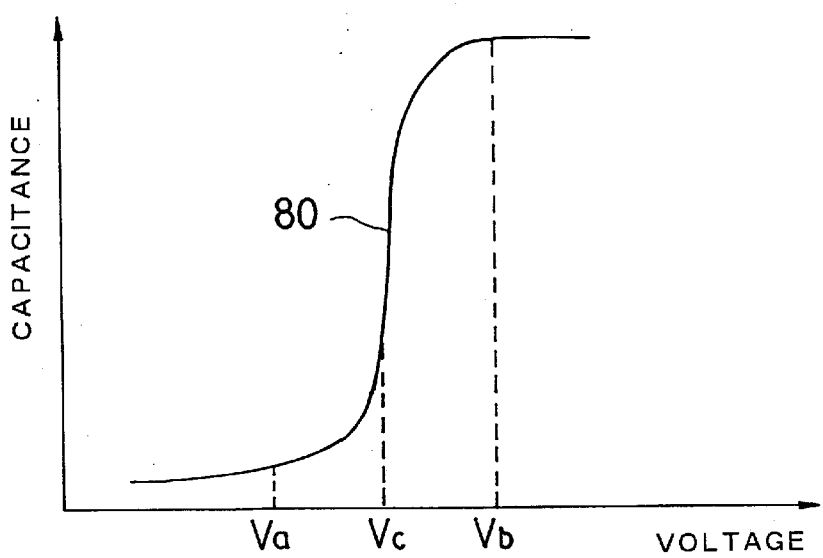
FIG. 14 is a line graph showing the relation between the applied voltage and the capacitance value of the conventional MIS variable capacitor.

When the applied voltage Vi is at the voltage value V1 (negative voltage to terminal 51 and positive voltage to terminal 58) shown in FIG. 9, holes of majority carriers are induced, which allows an accumulation layer 33 to form in the vicinity of the surface of the covered region 37a in the P region 37 of the MIS variable capacitor element 57, and electrons of minority carriers are induced, which allows an inversion layer 43 and a depletion layer 47 to form in the vicinity of the covered region 38a in the P region 38 of the MIS variable capacitor element 59, as shown in FIG. 6.

Contrarily, when the applied voltage Vi is at the voltage value V4 (positive voltage to the terminal 51 and negative voltage to the terminal 58) shown in FIG. 9, the state of the MIS variable capacitor element 57 is the same as that of the MIS variable capacitor element 59 when the applied voltage Vi is at the voltage value V1. On the other hand, the state of the MIS variable capacitor element 59 is the same as that of the MIS variable capacitor element 57 when the applied voltage Vi is at the voltage value V1.

Accordingly, as shown in FIG. 9, when the applied voltage is changed from the voltage value V1 to the voltage value V4, the capacitance value of the MIS variable capacitor element 57 varies as shown by a curved line 71 (a two-dotted broken line), and the capacitance value of the MIS variable capacitor element 59 varies as shown by a curved line 73 (broken line). Both curved lines 71 and 73 make a symmetrical form with respect to a straight line 74 which passes of the intermediate value between the voltage values V1 and V4.

Figure 7:
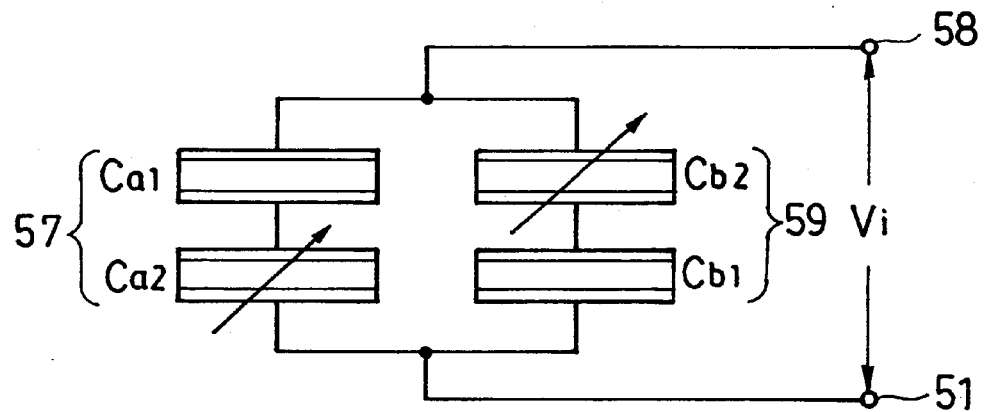
FIG. 7 is an equivalent circuit diagram of the second MIS variable capacitor.

The MIS variable capacitor, as shown in FIG. 7, is formed what the MIS variable capacitor element 57 and the MIS variable capacitor element 59 are connected in parallel, therefore its capacitance value is a parallel combined capacitance value, that is, a total value of respective capacitance values of the MIS variable capacitor elements 57 and 59.

Accordingly, the capacitance value of the MIS variable capacitor of this embodiment varies as shown by a curved line 75 (solid line) in FIG. 9, which means that the constant capacitance value increases, but also the range of voltage where the capacitance value decreases becomes small, and the amount of reduction thereof becomes reduced. Thereby, the aforesaid capacitor becomes further preferable to be used as a standard capacitor for phase compensation of an amplifier or the like.

The MIS variable capacitor is quite good in responsivity in a range of voltage where the capacitance value varies in accordance with the applied voltage Vi, similarly to the first embodiment.

In the above described example, a pair of MIS variable capacitor elements are connected in parallel, with polarities being placed in reverse, to form the MIS variable capacitor. However, any plural number of MIS variable capacitor elements may be employed for forming a MIS variable capacitor. The plurality of MIS variable capacitor elements are divided into two groups by one or more MIS variable capacitor elements (the numbers of MIS variable capacitor elements of both groups are not necessarily equal), and the MIS variable capacitor elements forming the respective groups may be connected one another in the respective groups as shown in FIG. 5.

Third embodiment:

Next, the third embodiment of the MIS variable capacitor according to this invention will be explained with reference to FIG. 10.

FIG. 10 is a schematic sectional view showing the structure of the MIS variable capacitor.

In the MIS variable capacitor, as shown in FIG. 10, a first MIS variable capacitor element group 62 and a second MIS variable capacitor element group 65 are formed on an N type semiconductor substrate 15 of a first conduction type.

The first MIS variable capacitor element group 62 has a structure in which two MIS variable capacitor elements 571 and 572 are connected in parallel. The second MIS variable capacitor element group 65 has a structure in which two MIS variable capacitor elements 591 and 592 are connected in parallel. It should be noted that the MIS variable capacitor elements 571 and 572 have the same structure as that of the MIS variable capacitor element 57 shown in FIG. 5 and FIG. 6, and the MIS variable capacitor elements 591 and 592 have the same structure as that of the MIS variable capacitor element 59.

More specifically, insulating films 551, 552, 561, 562 and conducting films 531, 532, 541, 542 are respectively formed in layers on four P regions 371, 372, 381, 382 which are formed in the N type of semiconductor substrate 15 to form a capacitor structure of "conducting film—insulating film—semiconductor".

As shown in FIG. 10, the conducting films 531 and 532 of the two MIS variable capacitor elements 571 and 572 forming the first MIS variable capacitor element group 62 are connected by an interconnection 61a and connected to a terminal 61, and moreover connected to heavily doped P regions 491, 492 and heavily doped N regions 411, 412 of the MIS variable capacitor elements 591, 592 forming the second MIS variable capacitor element group 65.

Furthermore, heavily doped P regions 391, 392 and heavily doped N regions 311, 312 of the MIS variable capacitor elements 571 and 572 are connected one another and connected to the conducting films 541 and 542 of the MIS variable capacitor elements 591, 592 by an interconnection 68a. The interconnection 68a is connected to a terminal 68.

By the above connection, the MIS variable capacitor elements 571, 572 of the first MIS variable capacitor element group 62 and the MIS variable capacitor elements 591, 592 of the second MIS variable capacitor element group 65 become to be connected in parallel, with respective polarities being arranged in reverse. When the above capacitor is used, upon applying voltage between the terminals 61 and 68, the functions are as follows.

In this example, the first MIS variable capacitor element group 62 has a structure in which the two MIS variable capacitor elements 571 and 572, each having the same structure as that of the MIS variable capacitor element 57 of the second embodiment, are connected in parallel, which is equivalent to two MIS variable capacitor elements 57 being connected in parallel, thus being twice as large in capacitance value as the MIS variable capacitor element 57 and showing the same characteristics in variation of the capacitance value to the applied voltage as the MIS variable capacitor element 57.

The second MIS variable capacitor element group 65 has a structure in which the two MIS variable capacitor elements 591 and 592, each having the same structure as that of the MIS variable capacitor element 59 of the second embodiment, are connected in parallel, which is equivalent to what two MIS variable capacitor elements 59 being connected in parallel, thus being twice as large in capacitance value as the MIS variable capacitor element 59 and showing the same characteristics in variation of the capacitance value to the applied voltage as the MIS variable capacitor element 59.

Accordingly, the MIS variable capacitor of the third embodiment is twice as large in capacitance value and shows the same characteristics as the MIS variable capacitor in the second embodiment.

Additionally, in this embodiment, the number of the MIS variable capacitor elements forming each MIS variable capacitor element group may be two or more, and the number of the MIS variable capacitor element groups may be also plural. The plurality of MIS variable capacitor elements are divided into two parts by one or more MIS variable capacitor element groups (the numbers of MIS variable capacitor element groups of both parts are not necessarily equal), and the MIS variable capacitor element groups forming the respective parts may be connected to one another in the respective parts as shown in FIG. 10.

Moreover, in the aforesaid second and third embodiments, the semiconductor region for forming a capacitor is the P region formed in the N type semiconductor substrate, and may be the N region formed in the P type semiconductor substrate.

Furthermore, in each explanation of each aforesaid embodiment, the first conduction type of semiconductor is the N type and the second conduction type is the P type, and vice versa the first conduction type may be the P type and the second conduction type may be the N type.

Figure 11:
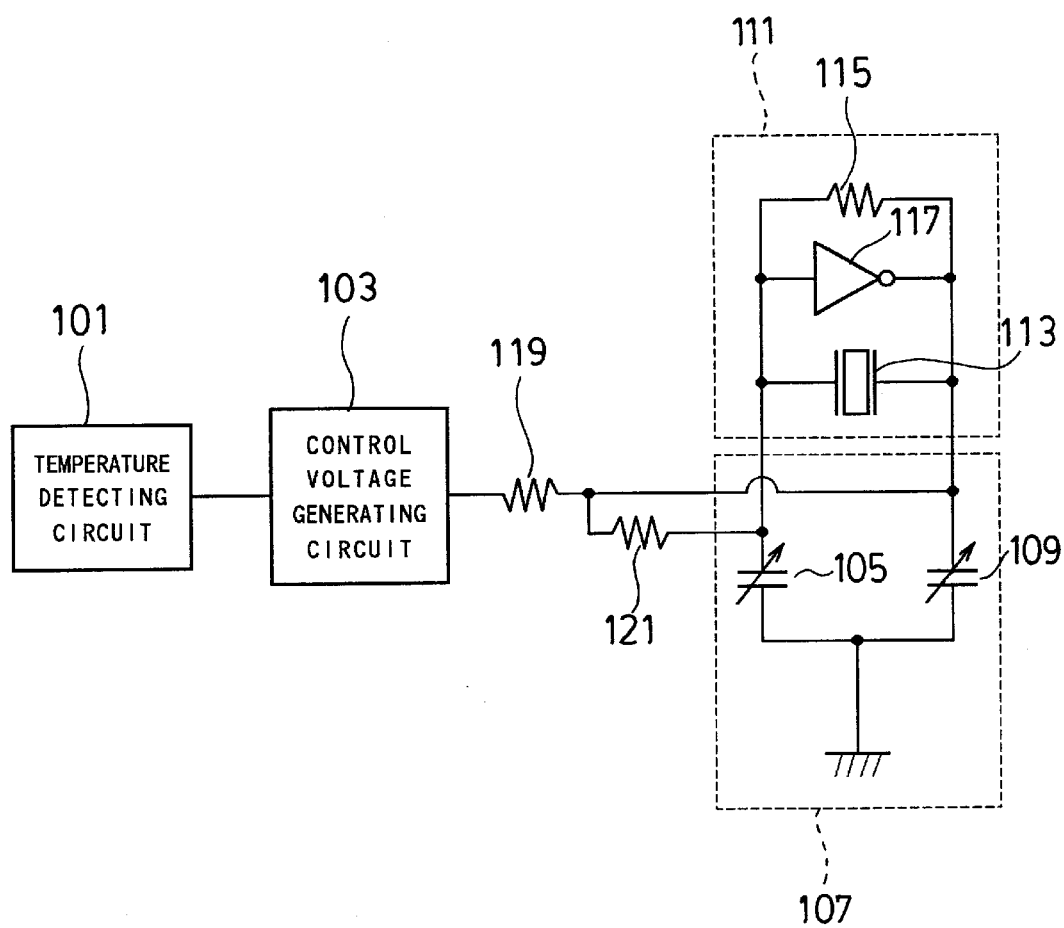
FIG. 11 is a block circuit view showing the structure of an embodiment of a temperature-compensated oscillator according to the present invention.
Figure 12:
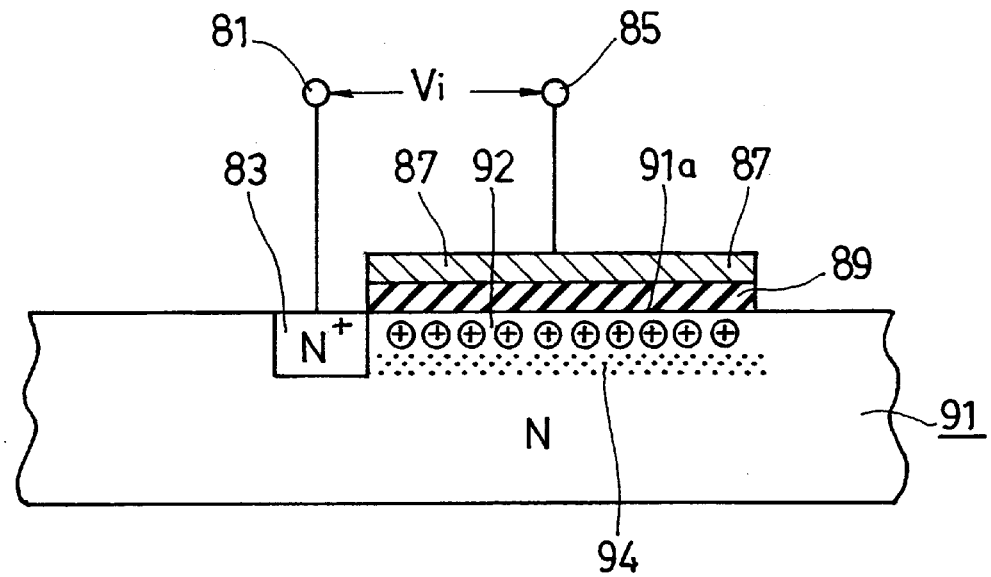
FIG. 12 is a schematic sectional view showing the structure of a conventional MIS variable capacitor.
Figure 13:
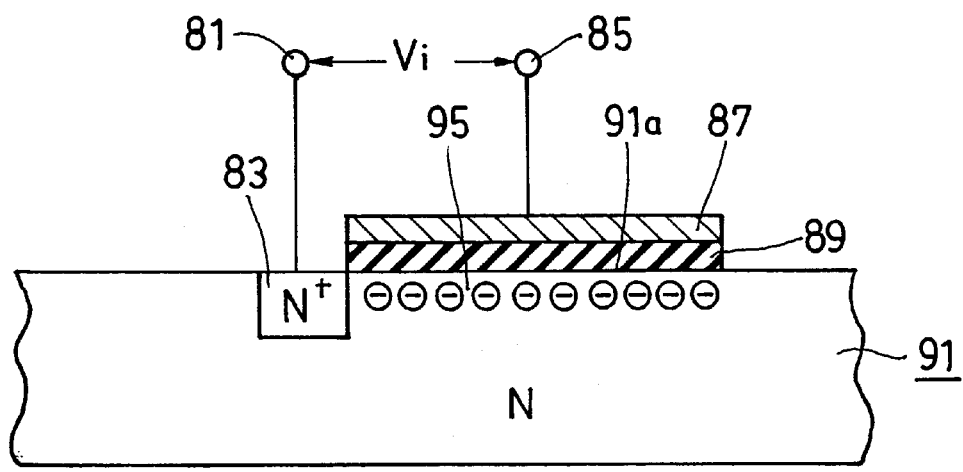
FIG. 13 is a schematic view for explaining the properties of the conventional MIS variable capacitor.

Temperature-compensated oscillator:

Next, an embodiment of the temperature-compensated oscillator according to this invention will be explained with reference to FIG. 11. FIG. 11 is a block circuit diagram showing the structure of the temperature-compensated oscillator.

The temperature-compensated oscillator is composed of a temperature detecting circuit 101, a control voltage generating circuit 103, a frequency adjusting circuit 107, an oscillation circuit 111, and resistances 119, 121.

The oscillation circuit 111 is a crystal resonance circuit which is composed of a crystal resonator 113, an inverter 117, and a feedback resistance 115.

The frequency adjusting circuit 107 consists of two voltage variable capacitors 105, 109, which are connected between both ends of the crystal resonator 113 of the oscillation circuit 111 and the earth respectively. The voltage variable capacitors 105, 109 are MIS variable capacitors according to this invention as explained with reference to FIG. 1 and FIG. 2.

More specifically, the voltage variable capacitors 105, 109 each have a capacitor structure of "conducting film—insulating film—semiconductor" in which an insulating film and a conducting film are formed in that order on a semiconductor of a first conduction type, in which a region of a second conduction type is provided in the semiconductor of the first conduction type to contact a region which is covered with the conducting film.

The temperature detecting circuit 101 detects the temperature of the oscillation circuit 111 and outputs a signal in correspondence with the detected temperature.

The control voltage generating circuit 103 inputs the signal from the temperature detecting circuit 101 and generates a control voltage, and applies the control voltage across each voltage variable capacitor 105, 109 of the frequency adjusting circuit 107 through the resistances 119, 121 to control the respective capacitance values.

The resistances 119, 121 are provided to prevent stray capacitance of the control voltage generating circuit 103 from exerting an influence in capacitance upon the voltage variable capacitors 105, 109 forming the frequency adjusting circuit 107.

In the temperature-compensated oscillator, when the oscillation circuit 111 changes in temperature and the oscillation frequency changes due to the temperature characteristics of the crystal resonator 113 and the like, the temperature detecting circuit 101 detects the temperature change and enters a signal corresponding to the detected temperature into the control voltage generating circuit 103. The control voltage generating circuit 103 generates a control voltage, in accordance with the entered signal, which is applied to the voltage variable capacitors 105, 109 of the frequency adjusting circuit 107 through the resistances 119, 121. Thereby, capacitances of the voltage variable capacitors 105, 109 vary with a quickly in response to the applied voltage and instantaneously control the oscillation frequency of the oscillation circuit 111 so as to compensate for the frequency change caused by the temperature change.

Thus, the oscillation circuit 111 can always oscillate at a constant frequency in spite of changes in surrounding temperature, and can compensate the temperature with a good response.

The oscillation circuit is not limited to the crystal resonance circuit.

As has been described, in the MIS variable capacitor according to this invention, the region of the second conduction type, which is the supply source of minority carriers, is formed on the semiconductor substrate of the first conduction type, which accelerates or strengthens supplying minority carriers, so that the inversion layer is hastened to form and so the capacitance variation can greatly improve in response to the voltage change.

Furthermore, the region of the second conduction type is electrically connected to the semiconductor substrate of the first conduction type, which can prevent the drop in capacitance caused by the existence of the depletion layer and enlarge a range where the capacitance value is constant. Therefore, the MIS variable capacitor according to this invention becomes easy use as a standard capacitor with a fixed capacitance for phase compensation of an amplifier or the like.

Consequently, the temperature-compensated oscillator, having the frequency adjusting circuit which is provided with the MIS variable capacitor according to this invention as a voltage variable capacitor, varies quickly in capacitance of the capacitor in relation to the change in control voltage corresponding to the temperature variation, and controls the oscillation frequency of the oscillation circuit, thus always oscillating at a constant frequency in spite of variations in temperature and so resulting in temperature compensation with a good response.

What is claimed is:

1. A temperature-compensated oscillator, including an oscillation circuit, a temperature detecting circuit detecting the temperature of the oscillation circuit, a control voltage generating circuit inputting a signal corresponding to the temperature detected by the temperature detecting circuit and generating a control voltage, and a frequency adjusting circuit having a voltage variable capacitor which varies in capacitance corresponding to the control voltage from the control voltage generating circuit, and controlling the oscillation frequency by said oscillation circuit, wherein said voltage variable capacitor of said frequency adjusting circuit has a capacitor structure of "conducting film—insulating film—semiconductor" composed of a semiconductor of a first conduction type, an insulating film formed on the semiconductor of the first conduction type, and a conducting film formed on the insulating film, in which a region of a second conduction type is provided in said semiconductor of the first conduction type to contact a covered region covered with said conducting film.

2. The temperature-compensated oscillator according to claim 1, wherein said semiconductor of the first conduction type and said region of the second conduction type of said MIS variable capacitor are electrically connected.

3. The temperature-compensated oscillator according to claim 1, wherein said semiconductor of the first conduction type of said MIS variable capacitor is an N type semiconductor substrate and said region of the second conduction type is a P region.

4. The temperature-compensated oscillator according to claim 2, wherein said semiconductor of the first conduction type of said MIS variable capacitor is an N type semiconductor substrate and said region of the second conduction type is a P region.

5. The temperature-compensated oscillator according to claim 1, wherein said semiconductor of the first conduction type of said MIS variable capacitor is a P type semiconductor substrate and said region of the second conduction type is an N region.

6. The temperature-compensated oscillator according to claim 2, wherein said semiconductor of the first conduction type of said MIS variable capacitor is a P type semiconductor substrate and said region of the second conduction type is an N region.

7. The temperature-compensated oscillator according to claim 1, wherein a region of the first conduction type having an impurity concentration heavier than that of said semiconductor of the first conduction type is provided in the semiconductor of said MIS variable capacitor without contacting said region of the second conduction type.

8. The temperature-compensated oscillator according to claim 2, wherein a region of the first conduction type having an impurity concentration heavier than that of said semiconductor of the first conduction type is provided in the semiconductor of said MIS variable capacitor without contacting said region of the second conduction type.

* * * * *